(12) United States Patent
Kinoshita

(10) Patent No.: US 8,285,501 B2
(45) Date of Patent: Oct. 9, 2012

(54) BATTERY PACK AND DETECTION METHOD

(75) Inventor: Satoshi Kinoshita, Fukushima (JP)

(73) Assignee: Sony Corporation, Tokyo (JP)

( * ) Notice: Subject to any disclaimer, the term of this patent is extended or adjusted under 35 U.S.C. 154(b) by 338 days.

(21) Appl. No.: 12/691,178

(22) Filed: Jan. 21, 2010

(65) Prior Publication Data

US 2010/0211341 A1  Aug. 19, 2010

(30) Foreign Application Priority Data

Feb. 17, 2009  (JP) ................. 2009-034121

(51) Int. Cl.
  *G01R 31/36*  (2006.01)
(52) U.S. Cl. ........................................ 702/63
(58) Field of Classification Search ............ 702/63; 320/134, 136
  See application file for complete search history.

(56) References Cited

U.S. PATENT DOCUMENTS

| | | | |
|---|---|---|---|
| 5,903,131 A * | 5/1999 | Sekine et al. ............... | 320/106 |
| 6,222,348 B1 | 4/2001 | Sato et al. | |
| 2007/0216366 A1 * | 9/2007 | Inamine et al. ............. | 320/132 |
| 2008/0054908 A1 | 3/2008 | Suzuki | |

FOREIGN PATENT DOCUMENTS

| | | |
|---|---|---|
| JP | 5-128027 | 5/1993 |
| JP | 11-206027 | 7/1999 |
| JP | 11-233157 | 8/1999 |
| JP | 2002-345161 | 11/2002 |
| JP | 2005-353518 | 12/2005 |
| JP | 2007-194052 | 8/2007 |
| JP | 2008-21619 | 1/2008 |
| JP | 2008-41280 | 2/2008 |

OTHER PUBLICATIONS

Office Action issued Oct. 5, 2010 in JP Application No. 2009-034121.

* cited by examiner

*Primary Examiner* — Bryan Bui
(74) *Attorney, Agent, or Firm* — Oblon, Spivak, McClelland, Maier & Neustadt, L.L.P.

(57) ABSTRACT

A battery pack includes: a plurality of batteries; a detection section to measure a voltage of each of the plurality of batteries to obtain a voltage variation of each of the plurality of batteries at different lapse times and compare the obtained voltage variations to thus detect whether at least one of the plurality of batteries has been replaced; and a controller to disable, when a result of the detection by the detection section indicates that at least one of the plurality of batteries has been replaced, a use of the plurality of batteries.

10 Claims, 10 Drawing Sheets

| k | V1 | V2 | V3 | V_avg |
|---|---|---|---|---|
| 0 | V1_mes[0] | V2_mes[0] | V3_mes[0] | V_avg[0] |
| 1 | V1_mes[1] | V2_mes[1] | V3_mes[1] | V_avg[1] |
| 2 | V1_mes[2] | V2_mes[2] | V3_mes[2] | V_avg[2] |
| 3 | V1_mes[3] | V2_mes[3] | V3_mes[3] | V_avg[3] |
| ⋮ | ⋮ | ⋮ | ⋮ | ⋮ |
| m | V1_mes[m] | V2_mes[m] | V3_mes[m] | V_avg[m] |

$R_0 = \dfrac{\Delta V}{\Delta I}$

BATTERY PACK AND DETECTION METHOD

CROSS REFERENCE TO RELATED APPLICATIONS

The present application contains subject matter related to that disclosed in Japanese Priority Patent Application JP 2009-034121 filed in the Japan Patent Office on Feb. 17, 2009, the entire content of which is hereby incorporated by reference.

BACKGROUND OF THE INVENTION

1. Field of the Invention

The present invention relates to a battery pack and a detection method, more specifically, to a secondary battery pack including, for example, a lithium-ion secondary battery and a detection method executed by the secondary battery pack.

2. Description of the Related Art

In recent years, along with prevalence of portable electronic apparatuses such as a laptop PC (Personal Computer), a cellular phone, and a PDA (Personal Digital Assistance), lithium-ion secondary batteries having advantages of a high voltage, a high energy density, and light weight are widely used as power sources.

A battery pack accommodating a battery cell constituted of such a secondary battery is provided with a protection circuit for prohibiting charge and discharge when an anomaly in the battery cell is detected. Specifically, for example, a voltage, a charge-discharge current, a temperature, and the like of the battery cell is measured every time a predetermined time passes to thus detect an anomaly such as overcharge, over discharge, and overcurrent with respect to the secondary battery based on a result of the measurement. Then, when any of the anomalies as described above is detected, control is performed to turn off a charge-discharge switch for controlling charge and discharge or prohibit charge and discharge with respect to the secondary battery by fusing a temperature fuse.

Moreover, the battery cell deteriorates due to a repetition of the charge and discharge, and a battery capacity is thus reduced. In addition, when the battery cell is used for over a long period of time such as about several years, the battery cell may become unusable. In such a case, the battery cell may need to be replaced for restoring the battery capacity of the battery cell to a level equal to or higher than a level of a new battery cell.

When the battery cell is replaced improperly, a newly-replaced battery cell and the battery cell originally accommodated in the battery pack may differ in characteristics. Since a control specification of the protection circuit is determined in accordance with characteristics of the original battery cell, when the battery cell is replaced improperly, there is fear that an anomaly of the battery pack cannot be detected to thus result in an inconvenience of the battery pack. Therefore, the replacement of a battery cell is normally conducted on a manufacturer side. A user is prohibited from opening a battery pack and improperly replacing a battery cell.

For example, Japanese Patent Application Laid-open No. 2005-353518 (hereinafter, referred to as Patent Document 1) discloses a battery pack that is capable of recognizing an alteration history of opening a battery pack and replacing a battery cell.

SUMMARY OF THE INVENTION

However, although an alteration history of the battery pack can be obtained by the method disclosed in Patent Document 1, it is difficult to prevent an improper alteration such as a replacement of a battery cell from being made, thus leading to a problem that it is possible to actually use a battery pack whose battery cell or protection circuit has been replaced.

Moreover, in recent years, highly-accurate remaining capacity estimation processing, high-safety control processing, and the like are demanded, and the number of processing functions are increasing and processing contents are becoming more complex along with an yearly improvement in performance of an integrated circuit mounted on the secondary battery pack.

For detecting an improper replacement of a battery cell as described above, the number of processing functions may need to be increased and the processing contents may need to be made more complex. Therefore, there may be a need to perform complicated calculations beyond a calculation capability of the integrated circuit mounted on the secondary battery pack or perform calculation processing based on a large amount of measurement data exceeding a memory capacity of the integrated circuit.

Thus, there is a need for a battery pack and a detection method that are capable of inhibiting the battery pack from being used upon detecting a replacement of a battery cell.

In addition, there is also a need for a battery pack and a detection method that are capable of executing complicated data processing beyond a processing capability of an integrated circuit mounted on the battery pack.

According to an embodiment of the present invention, there is provided a battery pack including: a plurality of batteries; a detection section to measure a voltage of each of the plurality of batteries to obtain a voltage variation of each of the plurality of batteries at different lapse times and compare the obtained voltage variations to thus detect whether at least one of the plurality of batteries has been replaced; and a controller to disable, when a result of the detection by the detection section indicates that at least one of the plurality of batteries has been replaced, a use of the plurality of batteries.

The battery pack according to the embodiment of the present invention is structured to include: a plurality of batteries; a detection section to measure a voltage of each of the plurality of batteries to obtain a voltage variation of each of the plurality of batteries at different lapse times and compare the obtained voltage variations to thus detect whether at least one of the plurality of batteries has been replaced; and a controller to disable, when a result of the detection by the detection section indicates that at least one of the plurality of batteries has been replaced, a use of the plurality of batteries. With this structure, it is possible to inhibit the battery pack from being used at a time a replacement of a battery cell is detected.

According to another embodiment of the present invention, there is provided a battery pack including: a plurality of batteries; a measurement section to measure a voltage and a current of the plurality of batteries; a transmission section to transmit data on the voltage and the current measured by the measurement section to an external apparatus; and a reception section to receive a result of predetermined processing carried out by the external apparatus using the transmitted data on the voltage and the current.

The battery pack according to the embodiment of the present invention is structured to include: a plurality of batteries; a measurement section to measure a voltage and a current of the plurality of batteries; a transmission section to transmit data on the voltage and the current measured by the measurement section to an external apparatus; and a reception section to receive a result of predetermined processing carried out by the external apparatus using the transmitted data on the voltage and the current. With this structure, it is possible to execute complicated data processing beyond a processing capability of the integrated circuit mounted on the battery pack.

According to another embodiment of the present invention, there is provided a detection method including the steps of: measuring a voltage of each of a plurality of batteries included in a battery pack to obtain a voltage variation of each of the plurality of batteries at different lapse times and comparing the obtained voltage variations to thus detect whether at least one of the plurality of batteries has been replaced; and disabling, when a result of the detection indicates that at least one of the plurality of batteries has been replaced, a use of the plurality of batteries.

The detection method according to the embodiment of the present invention is structured to include the steps of: measuring a voltage of each of a plurality of batteries included in a battery pack to obtain a voltage variation of each of the plurality of batteries at different lapse times and comparing the obtained voltage variations to thus detect whether at least one of the plurality of batteries has been replaced; and disabling, when a result of the detection indicates that at least one of the plurality of batteries has been replaced, a use of the plurality of batteries. With this structure, it is possible to inhibit the battery pack from being used at a time a replacement of a battery cell is detected.

According to another embodiment of the present invention, there is provided a detection method including the steps of: measuring a voltage and a current of a plurality of batteries included in a battery pack; transmitting data on the measured voltage and current to an external apparatus; and receiving a result of predetermined processing carried out by the external apparatus using the transmitted data on the voltage and the current.

The detection method according to the embodiment of the present invention is structured to include the steps of: measuring a voltage and a current of a plurality of batteries included in a battery pack; transmitting data on the measured voltage and current to an external apparatus; and receiving a result of predetermined processing carried out by the external apparatus using the transmitted data on the voltage and the current. With this structure, it is possible to execute complicated data processing beyond a processing capability of the integrated circuit mounted on the battery pack.

According to the embodiments of the present invention, an improper battery replacement can be detected. Moreover, a battery pack can be inhibited from being used at a time the improper battery replacement is detected. Furthermore, complicated data processing beyond a processing capability of an integrated circuit mounted on the battery pack can be executed.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings. The embodiments described below are specific examples of the present invention and imposed with various technically-desirable limitations. However, a technical range of the present invention is not limited to the following embodiments unless stated otherwise. It should be noted that descriptions will be given in the following order.
1. First embodiment (first example of battery pack)
2. Second embodiment (second example of battery pack)
3. Third embodiment (third example of battery pack)
4. Other embodiments (modified example)

1. First Embodiment (Circuit Structure of Battery Pack)

Figure 1:
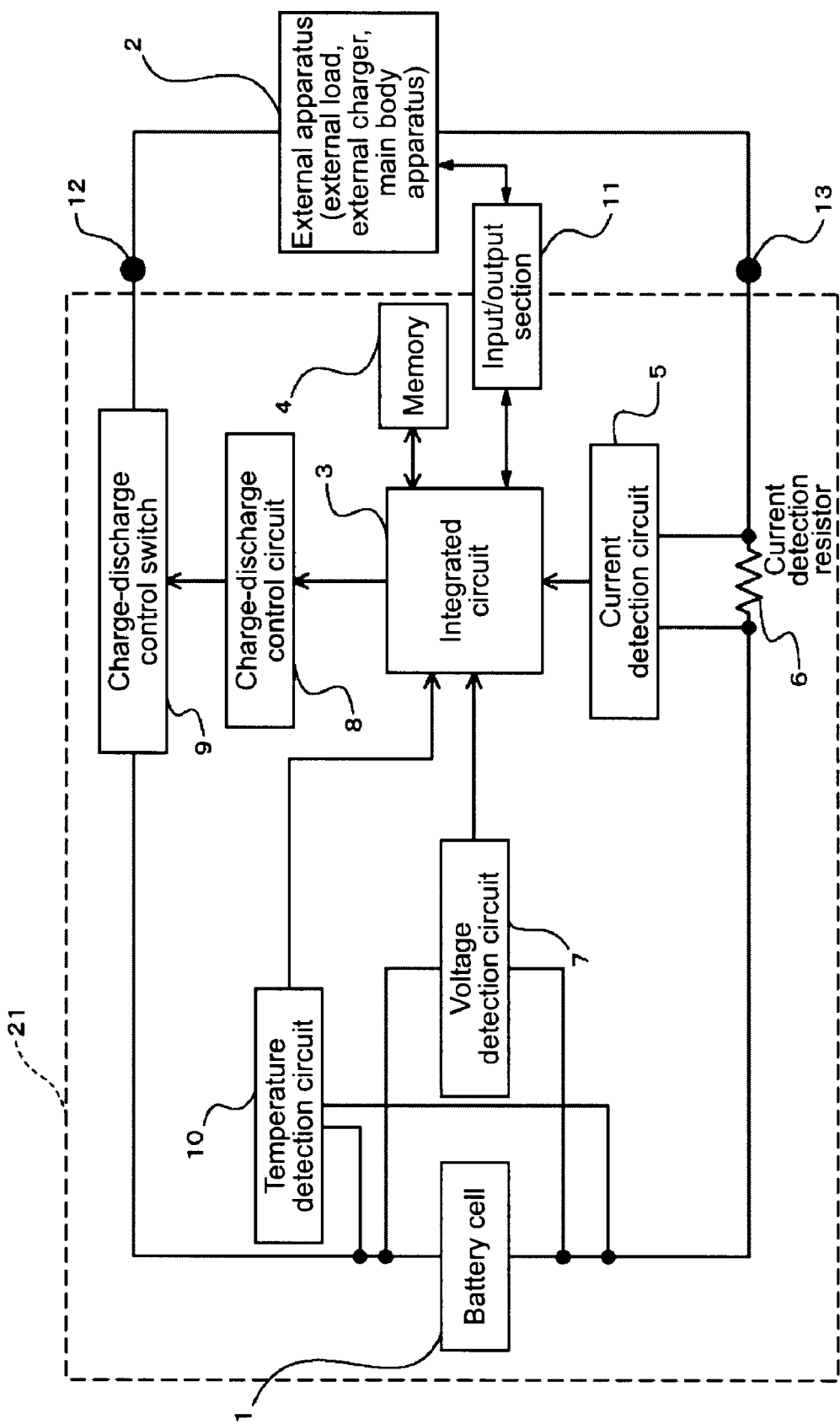
FIG. 1 is a block diagram showing a structural example of a battery pack according to a first embodiment of the present invention.

A circuit structure of a battery pack according to a first embodiment of the present invention will be described. FIG. 1 is a block diagram showing an example of the circuit structure of the battery pack according to the first embodiment of the present invention. As shown in FIG. 1, a secondary battery pack 21 includes a battery cell 1, a charge-discharge control switch 9, a temperature detection circuit 10, a voltage detection circuit 7, an integrated circuit 3, a charge-discharge control circuit 8, a current detection circuit 5, a current detection resistor 6, a memory 4, and an input/output section 11. A positive-electrode terminal 12 and a negative-electrode terminal 13 are respectively connected to a positive-electrode terminal and a negative-electrode terminal of an external apparatus 2. Examples of the external apparatus 2 include an external load, an external charger, and a main body apparatus connected to the secondary battery pack 21. Further, the external apparatus 2 includes an integrated circuit (not shown) constituted of a CPU (Central Processing Unit), a ROM (Read-Only Memory), a RAM (Random Access Memory), and the like.

The battery cell 1 is an assembled battery in which a plurality of secondary batteries are connected in series and/or parallel. The secondary battery is, for example, a lithium-ion secondary battery.

Though not shown, the integrated circuit 3 is constituted of a CPU (Central Processing Unit), a ROM (Read-Only Memory), a RAM (Random Access Memory), and the like. Connected to the integrated circuit 3 is the memory 4 as a nonvolatile memory such as an EEPROM (Electrically Erasable and Programmable Read Only Memory). With the RAM as a work memory, the integrated circuit 3 controls the components based on a program stored in the ROM in advance, for example. The voltage detection circuit 7 that detects a voltage of the battery cell 1 is connected to the integrated circuit 3.

The voltage detection circuit 7 is capable of detecting voltages of individual secondary batteries constituting the battery cell 1. Also connected to the integrated circuit 3 are the current detection circuit 5 that measures a current flowing through the current detection resistor 6 and the temperature detection circuit 10 that detects a temperature of the battery cell 1.

The integrated circuit 3 transmits/receives data to/from the external apparatus 2 via the input/output section 11. Moreover, the integrated circuit 3 collects and calculates measurement data. The integrated circuit 3 controls the charge-discharge control switch 9 via the charge-discharge control circuit 8 to control ON/OFF of a charge current (or discharge current). The integrated circuit 3 periodically measures voltages and a temperature of the battery cell 1 and a current flowing through the current detection resistor 6 via the current detection circuit 5, the voltage detection circuit 7, and the temperature detection circuit 10, for example.

The charge-discharge control circuit 8 measures the voltage of the battery cell 1 and the individual voltages of the secondary batteries constituting the battery cell 1 and also measures largeness and a direction of the current flowing through the current detection resistor 6 to thus control overcharge or over discharge of the secondary batteries based on the measurement result.

The charge-discharge control circuit 8 controls the charge-discharge control switch 9 to prevent overcharge or over discharge at a time the individual voltages of the secondary batteries constituting the battery cell 1 have reached an overcharge detection voltage or the individual voltages of the secondary batteries constituting the battery cell 1 have become equal to or smaller than an over-discharge detection voltage. Moreover, the integrated circuit 3 or the charge-discharge control circuit 8 performs control to block a current to be supplied to the secondary battery pack 21 by fusing a fuse (not shown), for example.

The charge-discharge control switch 9 is constituted of, for example, a charge control FET (Field Effect Transistor) and a discharge control FET. The charge control FET is turned off when the battery voltage reaches the overcharge detection voltage, to thus be controlled so that a charge current is not caused to flow. Moreover, the discharge control FET is turned off when the battery voltage becomes equal to or smaller than the over-discharge detection voltage, to thus be controlled so that a discharge current is not caused to flow.

(Operation of Battery Pack)

An operation of the battery pack according to the first embodiment of the present invention will be described. The secondary battery pack 21 is charged by the positive-electrode terminal 12 and the negative-electrode terminal 13 being respectively connected to the positive-electrode terminal and the negative-electrode terminal of the external apparatus 2 during charging. When using the main body apparatus as the external apparatus 2, the positive-electrode terminal 12 and the negative-electrode terminal 13 are respectively connected to a positive-electrode terminal and a negative-electrode terminal of the main body apparatus for discharge. The integrated circuit 3 detects a voltage of the battery cell 1 via the voltage detection circuit 7, detects a temperature of the battery cell 1 via the temperature detection circuit 10, and detects a current flowing through the current detection resistor 6 via the current detection circuit 5.

The integrated circuit 3 transmits data on the detected current, voltage, and temperature to the external apparatus 2 via the input/output section 11. Based on the data on the detected current, voltage, and temperature received from the secondary battery pack 21, the external apparatus 2 carries out processing of detecting an improper replacement of the battery cell 1. In other words, the external apparatus 2 carries out detection processing to judge whether at least one of the secondary batteries constituting the battery cell 1 has been replaced improperly.

The external apparatus 2 transmits a result of the detection processing to the integrated circuit 3 of the secondary battery pack 21 via the input/output section 11. When the processing result indicates an improper replacement of the battery cell 1, the integrated circuit 3 performs control to fuse the fuse (not shown) to disable the use of the secondary battery pack 21, for example.

Figure 2:
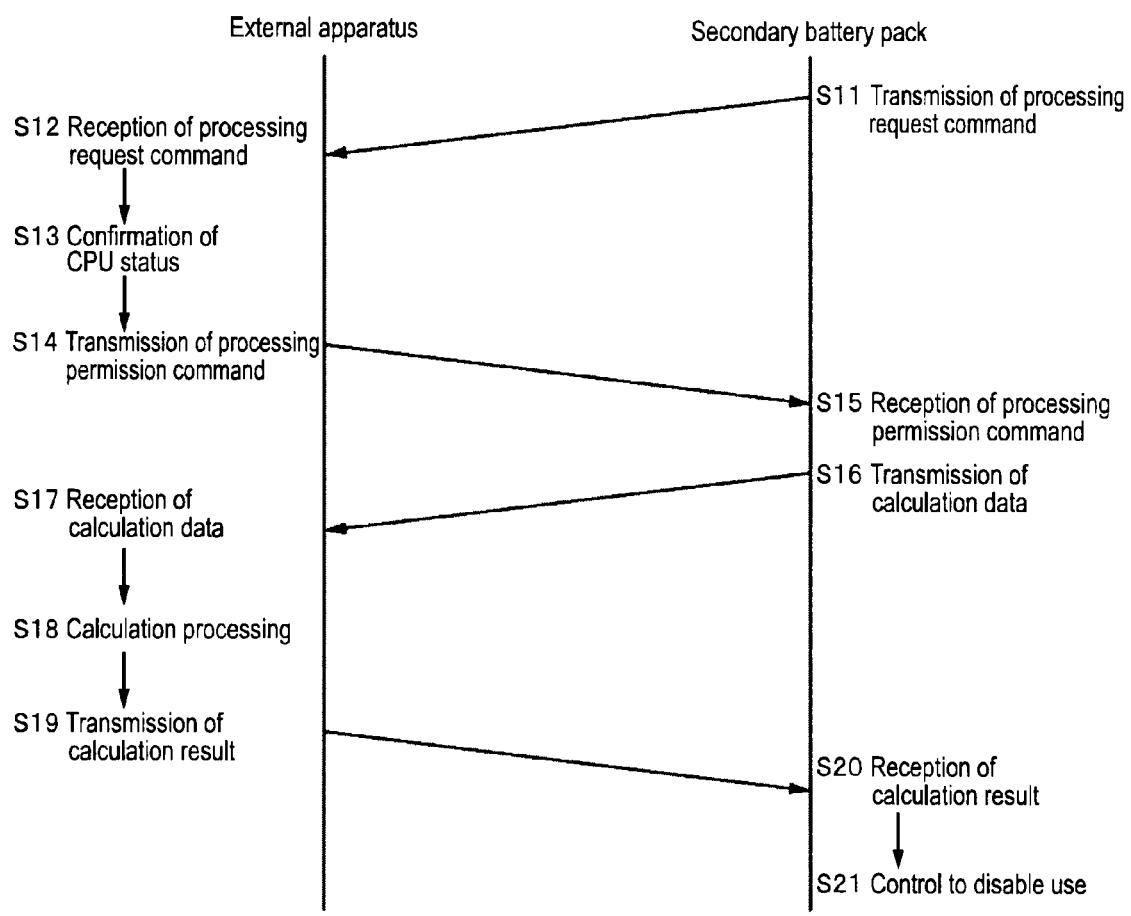
FIG. 2 is a sequence diagram for explaining a procedure of a detection method carried out in the battery pack according to the first embodiment of the present invention.

A series of processes is carried out by the following procedure. In the secondary battery pack 21, the integrated circuit 3 transmits the measurement data to the external apparatus 2. The external apparatus 2 processes the received data and transmits the processing result to the secondary battery pack 21. Based on the received processing result, the secondary battery pack 21 carries out predetermined processing. Referring to a sequence diagram of FIG. 2, procedures of data transmission/reception and data processing carried out between the secondary battery pack 21 and the external apparatus 2 will be described.

First, in Step S11, the secondary battery pack 21 transmits a processing request command to the external apparatus 2. Upon receiving the processing request command from the secondary battery pack 21 in Step S12, the external apparatus 2 checks a CPU status of the external apparatus 2 in Step S13. In Step S14, the external apparatus 2 transmits a processing permission command to the secondary battery pack 21.

Upon receiving the processing permission command from the external apparatus 2 in Step S15, the secondary battery pack 21 transmits calculation data to the external apparatus 2 in Step S16. The calculation data is data on a voltage, current, and temperature acquired by the integrated circuit 3 via the voltage detection circuit 7, the current detection circuit 5, and the temperature detection circuit 10, for example. It should be noted that the transmitted data is not stored in the memory of the integrated circuit 3 nor the memory 4.

Upon receiving the calculation data in Step S17, the external apparatus 2 carries out predetermined calculation processing using the received data in Step S18. Specifically, using the data transmitted from the secondary battery pack 21, the external apparatus 2 carries out processing that uses data of a size exceeding a capacity of the memory of the integrated circuit 3. The data transmission/reception between the secondary battery pack 21 and the external apparatus 2 are carried out via the input/output section 11 included in the secondary battery pack 21 and the external apparatus 2.

In Step S19, the external apparatus 2 transmits a result of the calculation processing to the secondary battery pack 21. Upon receiving the calculation result in Step S20, the secondary battery pack 21 performs predetermined control based on the received processing result in Step S21. For example, when the processing result indicates an improper replacement of the battery cell 1, control to disable the use of the secondary battery pack 21 is performed.

(Method of Detecting Improper Replacement of Battery Cell)

Figure 3:
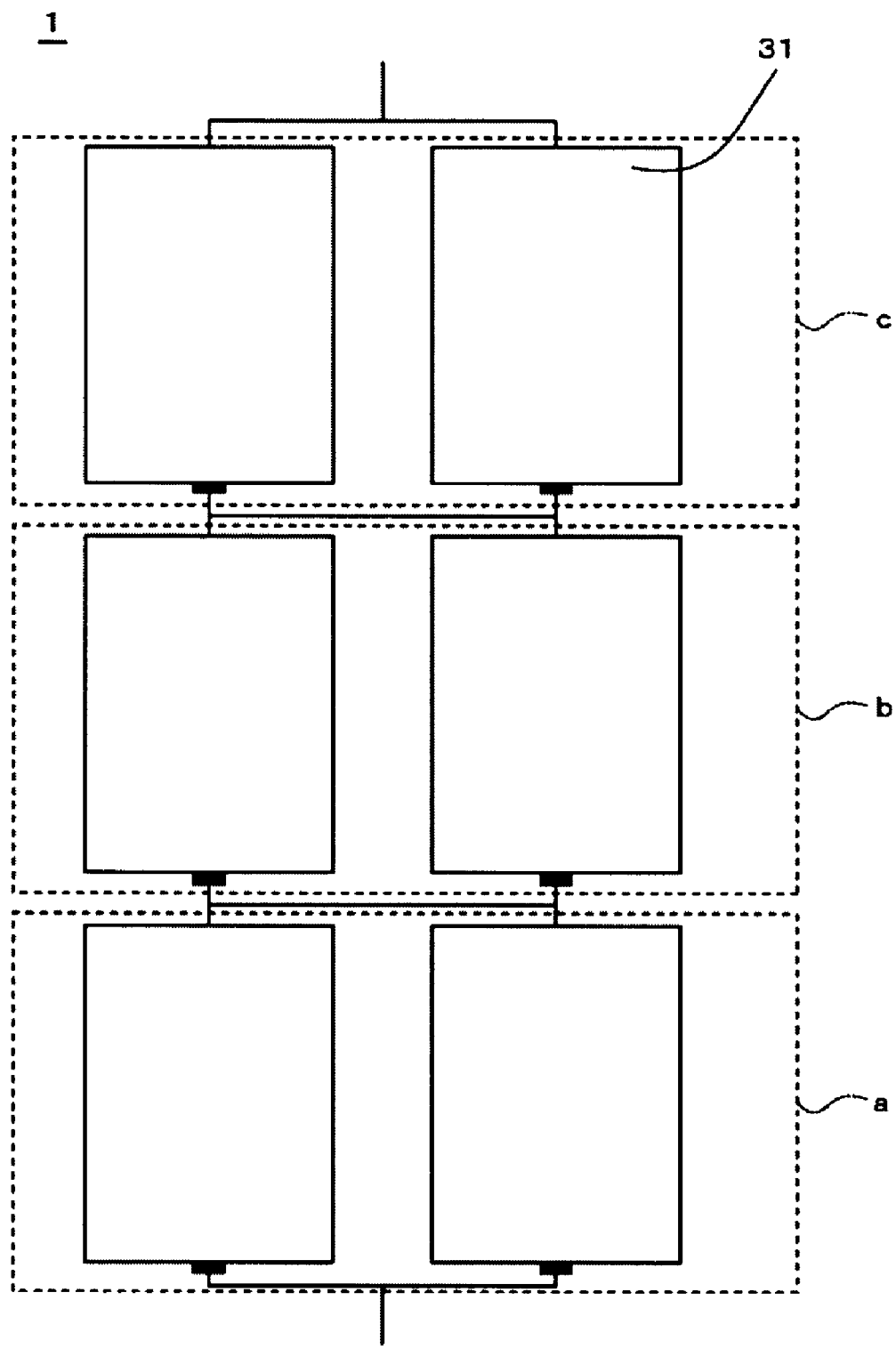
FIG. 3 is a schematic diagram showing a structural example of battery cells of the battery pack according to the first embodiment of the present invention.

Using an example of the assembled battery shown in FIG. 3, a method of detecting an improper replacement of the battery cell 1 will be described. In FIG. 3, a case where the battery cell 1 has a structure in which 6 secondary batteries 31 are connected in a 3-series 2-parallel (3S2P) form is shown as an example. Dividing the 6 secondary batteries 31 into three, the three pairs of secondary batteries 31 each connected in parallel are respectively referred to as assembled battery a, assembled battery b, and assembled battery c.

In the method of detecting an improper replacement of the battery cell 1, voltage variations of the assembled batteries a to c in a discharge process are obtained, and an improper replacement of the battery cell 1 is detected based on the obtained voltage variations.

(a) Regarding Theory for Detecting Improper Replacement of Battery Cell

Referring to FIG. 4, a theory for detecting an improper replacement of the battery cell based on the voltage variations of the assembled batteries a to c in a discharge process will be described.

Figure 4A:
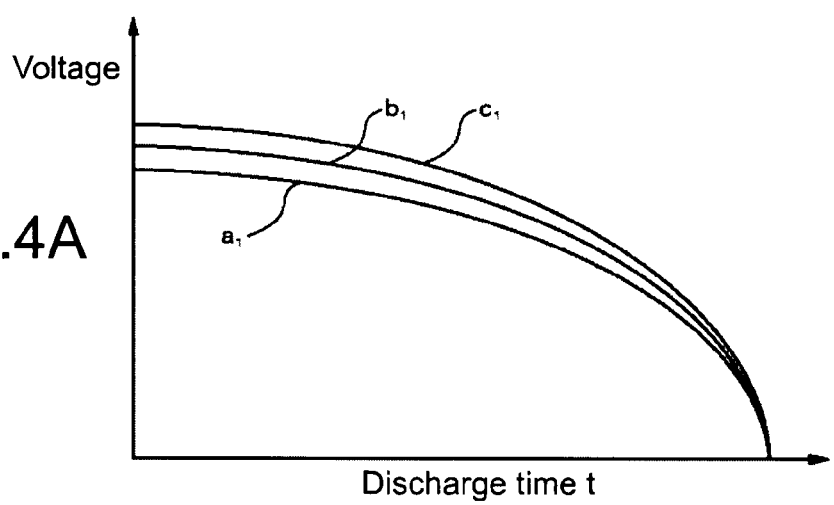
FIG. 4 are graphs showing discharge curves of assembled batteries a to c.
Figure 4B:
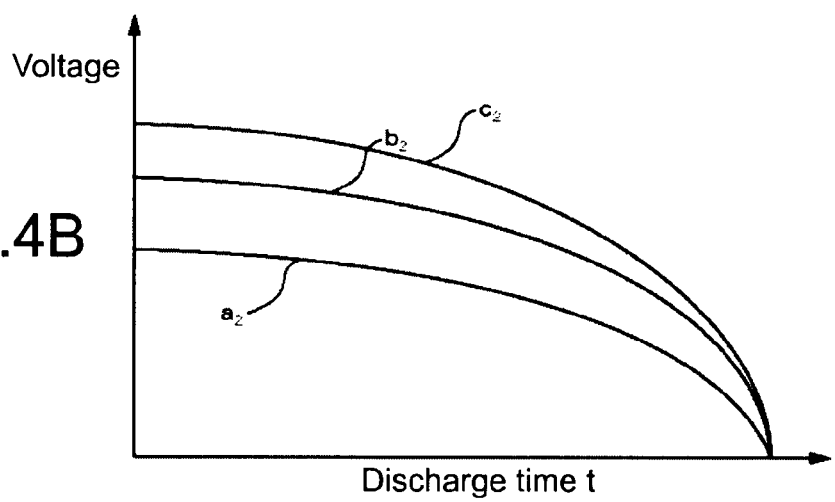
Figure 4C:
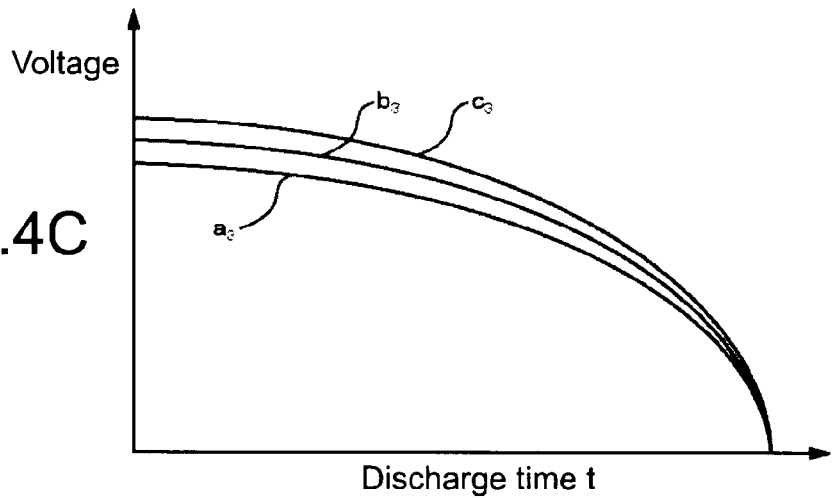

FIGS. 4A to 4C show discharge curves of the assembled batteries a to c at different lapse times. FIG. 4A shows time-series discharge curves of the assembled batteries a to c at an initial stage. FIG. 4B shows discharge curves of the assembled batteries a to c in a state where a time T1 has elapsed since the shipping. FIG. 4C shows discharge curves of the assembled batteries a to c in a state where a time T2 longer than the time T1 has elapsed since the shipping.

It should be noted that FIG. 4C shows discharge curves in a case where an improper replacement of the battery cell 1 is made. In FIGS. 4A to 4C, the lines $a_1$, $a_2$, and $a_3$ indicate discharge curves of the assembled battery a, the lines $b_1$, $b_2$, and $b_3$ indicate discharge curves of the assembled battery b, and the lines $c_1$, $c_2$, and $c_3$ indicate discharge curves of the assembled battery c.

As can be seen from comparing the discharge curves of FIGS. 4A and 4B, the voltage variations of the assembled batteries a to c are larger in the state where the time T1 has elapsed than in the initial stage. As described above, the voltage variations of the assembled batteries a to c have characteristics of becoming larger along with time under the same condition.

However, as can be seen from comparing the discharge curves of FIGS. 4B and 4C, the voltage variations of the assembled batteries a to c are smaller in the state where the time T2 has elapsed than in the state where the time T1 has elapsed. This is because the voltage variations of the assembled batteries a to c in the state where the time T2 has elapsed have become smaller due to an improper replacement of the battery cell 1 with a new undeteriorated battery cell, for example.

As described above, when the battery cell 1 is improperly replaced with a new undeteriorated battery cell, for example, the voltage variations of the assembled batteries a to c become smaller. Therefore, when the voltage variations of the assembled batteries a to c at a certain lapse time are smaller than the voltage variations of the assembled batteries a to c at a lapse time shorter than that lapse time, the improper replacement of the battery cell 1 can be detected assuming that the battery cell 1 has been replaced improperly.

Figure 5:
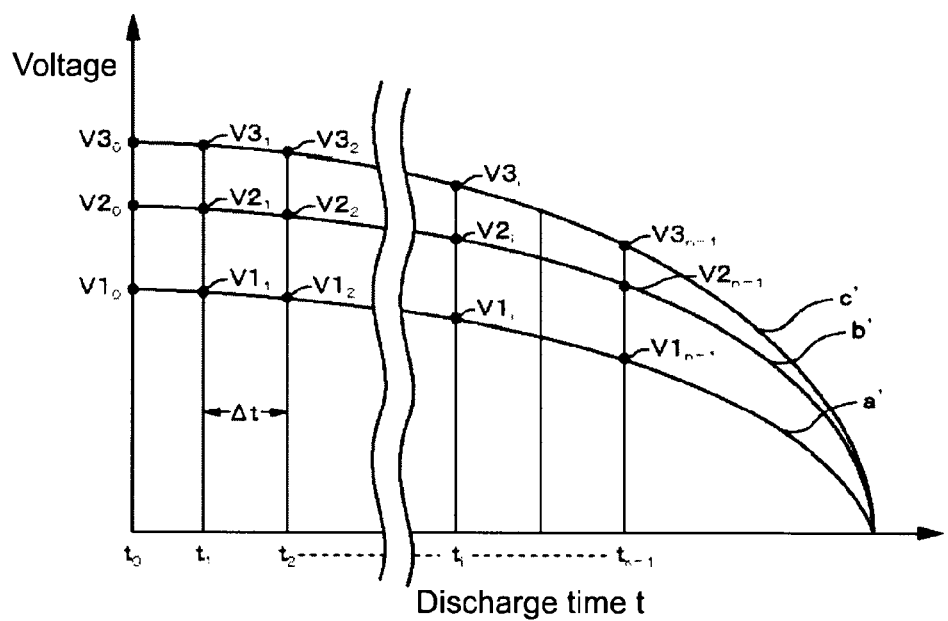
FIG. 5 is a graph for explaining a method of obtaining variations of voltages of batteries from the discharge curves of the assembled batteries.

(b) Regarding Method of Obtaining Voltage Variations of Assembled Batteries a to c Using discharge curves shown in FIG. 5, a method of obtaining voltage variations of the assembled batteries a to c will be described. It should be noted that in FIG. 5, the line a' indicates a discharge curve of the assembled battery a, the line b' indicates a discharge curve of the assembled battery b, and the line c' indicates a discharge curve of the assembled battery c.

A case where voltages of the assembled batteries a to c are measured n times (n is an integer of 1 or more) at predetermined time intervals Δt in the discharge process of the assembled batteries a to c is assumed. When a discharge time at an i-th (i is an integer of 0 or more and n−1 or less) measurement counting from the smallest discharge time is represented by $t_i$, a discharge time at a first measurement is represented by $t_0$, a discharge time at a second measurement is represented by $t_1$, and a discharge time at an n-th measurement is represented by $t_{n-1}$.

Further, when a measurement voltage of the assembled battery a at the discharge time $t_i$ is represented by $V1_i$, a measurement voltage of the assembled battery b at the discharge time $t_i$ is represented by $V2_i$, and a measurement voltage of the assembled battery c at the discharge time $t_i$ is represented by $V3_i$, the measurement voltages of the assembled batteries a to c at the discharge time $t_0$ are as follows. The measurement voltage of the assembled battery a at the discharge time $t_0$ is represented by $V1_0$, the measurement voltage of the assembled battery b at the discharge time $t_0$ is represented by $V2_0$, and the measurement voltage of the assembled battery c at the discharge time $t_0$ is represented by $V3_0$.

Furthermore, the measurement voltage of the assembled battery a at the discharge time $t_1$ is represented by $V1_1$, the measurement voltage of the assembled battery b at the discharge time $t_1$ is represented by $V2_1$, and the measurement voltage of the assembled battery c at the discharge time $t_1$ is represented by $V3_1$. Moreover, the measurement voltage of the assembled battery a at the discharge time $t_{n-1}$ is represented by $V1_{n-1}$, the measurement voltage of the assembled battery b at the discharge time $t_{n-1}$ is represented by $V2_{n-1}$, and the measurement voltage of the assembled battery c at the discharge time $t_{n-1}$ is represented by $V3_{n-1}$.

When a mean value of the measurement voltage $V1_i$ of the assembled battery a at the discharge time $t_i$, the measurement voltage $V2_i$ of the assembled battery b at the discharge time $t_i$, and the measurement voltage $V3_i$ of the assembled battery c at the discharge time $t_i$ is represented by $Vavg_i$, a mean value of the measurement voltages of the assembled batteries a to c at the discharge time $t_0$ can be represented by $Vavg_0$. Further, a mean value of the measurement voltages of the assembled batteries a to c at the discharge time $t_i$ can be represented by $Vavg_1$. In addition, a mean value of the measurement voltages of the assembled batteries a to c at the discharge time $t_{n-1}$ can be represented by $Vavg_{n-1}$. It should be noted that $Vavg_i$ is calculated from a calculation formula $Vavg_i = (V1_i + V2_i + V3_i)/3$.

The voltage variations of the assembled batteries a to c can be expressed by the following expression. In the expression below, first, for each measurement, a square sum of a deviation as a difference between the mean value Vavg of the measurement voltages V1, V2, and V3 of the assembled batteries a to c and each of the measurement voltages V1, V2, and V3 is obtained. Each of the square sums of the deviations of the measurement voltages V1, V2, and V3 indicate a variation degree of the measurement voltages V1, V2, and V3.

In the expression, the square sums of the deviations of the measurement voltages V1, V2, and V3 obtained for each measurement are added up and divided by the number of measured times n, with the result that a mean value of the square sums of the deviations of the measurement voltages V1, V2, and V3 for each measurement is calculated.

$$Imb = \frac{1}{n}\sum_{i=0}^{n-1}\left\{\begin{array}{l}(Vavg_i - V1_i)^2 + \\ (Vavg_i - V2_i)^2 + \\ (Vavg_i - V3_i)^2\end{array}\right\}$$ [Expression 1]

(c) Regarding Conditional Expressions for Detecting Improper Replacement of Battery Cell 1

The battery cell 1 has characteristics that, as long as an improper replacement of the battery cell 1 is not made, a capacity of a battery once deteriorated is not restored to its original capacity under the same condition. Moreover, as described above with reference to FIGS. 4A to 4C, the battery cell 1 also has characteristics that, as long as an improper replacement of the battery cell 1 is not made, voltage variations become larger as time elapses.

Based on those characteristics, conditional expressions for detecting an improper replacement of the battery cell 1 are expressed by the following expressions, for example. By judging whether the following conditions are satisfied using a voltage variation Imb obtained as described above and a temperature and capacity of the battery cell 1, an improper replacement of the battery cell 1 can be detected.

$TB-TA > 1000$ hours $CapB > CapA$ $ImbB < ImbA$ $|TempB - TempA| < 5$ degC

TB: Lapse time since shipping
TA: Lapse time since shipping shorter than TB
CapB: Capacity of battery cell 1 at TB
CapA: Capacity of battery cell 1 at TA
ImbB: Voltage variation of assembled batteries a to c at TB
ImbA: Voltage variation of assembled batteries a to c at TA
TempB: Temperature of battery cell 1 at TB
TempA: Temperature of battery cell 1 at TA Out of the conditional expressions above, TB−TA>1000 hours indicates that a difference between the lapse time TB after shipping and the lapse time TA after shipping exceeds 1000 hours. This condition is based on the fact that, when the difference between the lapse times is too short, there is not much difference between the capacities and a detection accuracy is lowered.

CapB>CapA indicates that the capacity CapB of the battery cell 1 at the lapse time TB after shipping is larger than the capacity CapA of the battery cell 1 at the lapse time TA after shipping. This is based on the characteristics that, as long as an improper replacement of the battery cell 1 is not made, a capacity of a battery once deteriorated is not restored to its original capacity under the same condition.

|TempB−TempA|<5 degC indicates that a difference between the temperature TempB of the battery cell 1 at the lapse time TB after shipping and the temperature TempA of the battery cell 1 at the lapse time TA after shipping is smaller than 5° C.

ImbB<ImbA indicates that the voltage variation ImbA at the lapse time TA after shipping is larger than the voltage variation ImbB at the lapse time TB after shipping. This condition is based on the characteristics that, as long as an improper replacement of the battery cell 1 is not made, the voltage variations become larger as time elapses.

It should be noted that the conditional expressions are mere examples and are not limited to those above. For example, although a detection accuracy is lowered, the conditional expression only needs to include at least a comparative condition ImbB<ImbA on the voltage variations.

(Detection Processing)

Referring to the flowchart of FIGS. 6 and 7, processing of detecting an improper replacement of the battery cell according to the first embodiment of the present invention will be described. It should be noted that descriptions will be given on the processing of detecting an improper replacement of the battery cell 1 in the case where the battery cell 1 has a structure in which 6 secondary batteries 31 shown in FIG. 3 are connected in a 3-series 2-parallel (3S2P) form.

Figure 6:
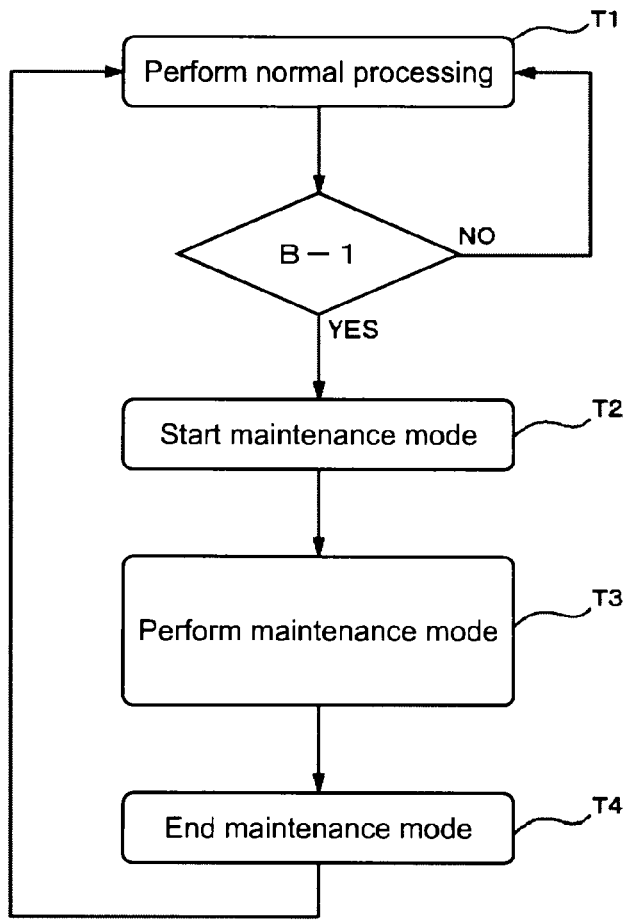
FIG. 6 is a flowchart for explaining a processing procedure of the detection method carried out in the battery pack according to the first embodiment of the present invention.

First, as shown in FIG. 6, when the secondary battery pack 21 receives a maintenance-mode shift signal from the external apparatus 2 in Step B-1, the process advances to Step T2 to start a maintenance mode, and the maintenance mode is performed in Step T3. Upon ending the maintenance mode in Step T4, the process returns to Step T1, and normal processing is carried out. When a maintenance-mode shift signal from the external apparatus 2 is not received by the secondary battery pack 21 in Step B-1, the normal processing of Step T1 is continued.

It should be noted that the maintenance mode is a mode executed by the external apparatus 2 for detecting an improper replacement of the battery cell 1. In the maintenance mode, when the battery cell 1 is not fully charged, the battery cell 1 is charged until it is fully charged, and discharge is started after the battery cell 1 is fully charged. On the other hand, when the battery cell 1 is fully charged, the battery cell 1 is charged no more and discharge is started as it is. In the maintenance mode, an improper replacement of the battery cell 1 is detected based on measurement data obtained in the discharge process.

Figure 7:
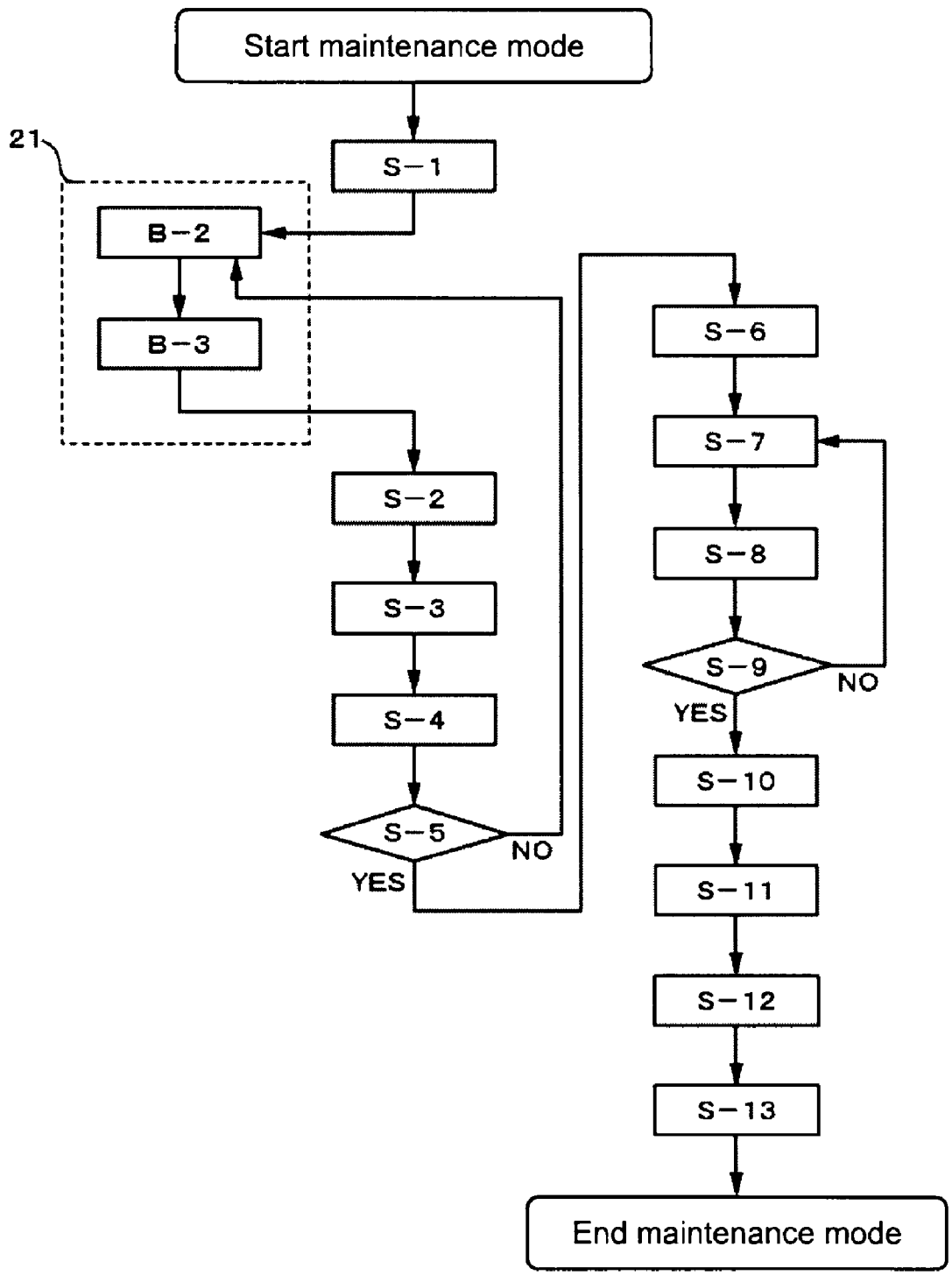
FIG. 7 is a flowchart for explaining a processing procedure of the detection method carried out in the battery pack according to the first embodiment of the present invention.

FIG. 7 shows a flowchart from a start of the maintenance mode to an end of the maintenance mode. In FIG. 7, processes of Steps B-2 and B-3 surrounded by a dotted line are processes carried out on the secondary battery pack 21 side, and other processes of Steps S-1 to S-13 are processes carried out on the external apparatus 2 side.

In Step S-1, an integrated circuit (not shown) of the external apparatus 2 executes processing of setting a variable k to be stored in a RAM of the integrated circuit to 0.

In Step B-2, measurements of voltages of the assembled batteries a to c, a current flowing through the battery cell 1, and a temperature of the battery cell 1 are carried out on the secondary battery pack 21 side. The integrated circuit 3 mounted on the secondary battery pack 21 measures the voltages of the assembled batteries a to c, the current flowing through the battery cell 1, and the temperature of the battery cell 1. Accordingly, the integrated circuit 3 of the secondary battery pack 21 acquires data on the measurement voltages V1, V2, and V3 of the assembled batteries a to c, the measurement current I_mes, and the measurement temperature Temp.

In Step B-3, the integrated circuit 3 of the secondary battery pack 21 transmits the data on the measurement voltages V1, V2, and V3, the measurement current I_mes, and the measurement temperature Temp to the external apparatus 2 via the input/output section 11.

In Step S-2, the external apparatus 2 receives the data on the measurement voltages V1, V2, and V3, the measurement current I_mes, and the measurement temperature Temp via the input/output section 11. The received data is stored in the memory (ROM or RAM) of the integrated circuit of the external apparatus 2, for example. The memory of the external apparatus 2 has a larger capacity than the memory of the secondary battery pack 21.

In Step S-3, the integrated circuit of the external apparatus 2 carries out the following setting processing using the received data. It should be noted that the data set herein is stored in the RAM of the integrated circuit of the external apparatus 2.

$$V1\_mes[k]=V1$$

$$V2\_mes[k]=V2$$

$$V3\_mes[k]=V3$$

$$V\_avg[k]=(V1+V2+V3)/3$$

$$I\_mes[k]=I\_mes$$

$$Temp\_mes[k]=Temp$$

In Step S-4, the integrated circuit of the external apparatus 2 executes processing of incrementing the value of k by 1. In Step S-5, the integrated circuit of the external apparatus 2 executes processing of confirming an end of discharge of the battery cell 1.

When the end of discharge of the battery cell 1 is confirmed by the integrated circuit of the external apparatus 2 in Step S-5, the process advances to Step S-6. When the end of discharge is not confirmed by the integrated circuit of the external apparatus 2 in Step S-5, the process returns to Step B-2 to measure voltages of the assembled batteries a to c, a current flowing through the battery cell 1, and a temperature of the battery cell 1 after an elapse of the time Δt since the previous measurement.

By repeating Steps B-2 to S-5 described above, data set as shown in FIG. 8, for example, is stored in the RAM of the integrated circuit of the external apparatus 2. In the data, a measurement voltage V1 at a k-th measurement is set as V1_mes [k], a k-th measurement voltage V2 is set as V2_mes [k], and a k-th measurement voltage V3 is set as V3_mes [k]. It should be noted that in the data shown in FIG. 8, for convenience of explanation, a value of the variable k at the time discharge is ended is represented by m.

In Step S-6, the integrated circuit of the external apparatus 2 carries out processing of setting the value of the variable k at the time discharge is ended to n. In the example of the data shown in FIG. 8, the value m of the variable k at the time discharge is ended is set to n. After that, the integrated circuit of the external apparatus 2 carries out processing of setting the variable k to 0 and processing of setting Imb to 0.

In Step S-7, the integrated circuit of the external apparatus 2 executes the following processing using the measurement voltages V1, V2, and V3 corresponding to the variable k and V_avg.

$$V\_avg=(V1+V2+V3)/3$$

$$Imb\_buf=(V1-V\_avg)^2+(V2-V\_avg)^2+(V3-V\_avg)^2$$

Specifically, the integrated circuit of the external apparatus 2 executes the following processing.

$$(V1\_mes[k]+V2\_mes[k]+V3\_mes[k])/3=V\_avg[k]$$

$$Imb\_buf=(V1\_mes[k]-V\_avg[k])^2+(V2\_mes[k]-V\_avg[k])^2+(V3\_mes[k]-V\_avg[k])^2$$

Then, in Step S-8, the integrated circuit of the external apparatus 2 executes processing of Imb=Imb+Imb_buf.

In Step S-9, the integrated circuit of the external apparatus 2 carries out processing of judging whether k≧n is satisfied. When judged in Step S-9 that k≧n is not satisfied, the processing of incrementing the value of k by 1 is carried out, and the process returns to Step S-7. When judged in Step S-9 that k≧n is satisfied, the process advances to Step S-10.

It should be noted that in Steps S-7 to S-9, the processing of adding up the square sums of the deviations of the measurement voltages V1, V2, and V3 for each measurement is carried out.

In Step S-10, the integrated circuit of the external apparatus 2 executes processing of calculating Imb=Imb/(n+1) and Cap=ΣI_mes/3600.

It should be noted that the processing of calculating Imb=Imb/(n+1) is processing in which a sum of the square sums of the deviations obtained by the processes of Steps S-7 to S-9 is divided by the number of measured times to thus calculate a mean value of the square sums of the deviations of the measurement voltages V1, V2, and V3 for each measurement. Moreover, the processing of calculating Cap=ΣI_mes/3600 is processing in which the sum of the measurement currents I is divided by 3600 obtained by converting 1 hour into seconds, to thus obtain a capacity of the battery cell 1.

In Step S-11, the processing result Imb is stored in the memory of the external apparatus 2. In Step S-12, using the processing result of the current maintenance mode and the processing result of the previous maintenance mode stored in the memory of the external apparatus 2, the integrated circuit of the external apparatus 2 carries out judgment processing on an improper replacement of the battery cell 1.

The judgment processing on an improper replacement of the battery cell 1 is carried out using the processing results Imb, Cap, Temp, and T (time of current maintenance mode) of the current maintenance mode and processing results Imb_pre, Cap_pre, Temp_pre, and T_pre (time of previous maintenance mode) of the previous maintenance mode stored in the memory of the external apparatus 2.

The judgment processing on an improper replacement of the battery cell 1 is carried out by judging whether the following conditional expressions are satisfied using the processing results described above. It should be noted that in a first maintenance mode, values of Imb_pre, Cap_pre, Temp_pre, and T_pre are values stored as initial values in the memory of the external apparatus 2, for example.

$$T-T\_pre>1000 \text{ hours}$$

$$Cap>Cap\_pre$$

$$Imb<Imb\_pre$$

$$|Temp-Temp\_pre|<5 \text{ degC}$$

In Step S-13, the integrated circuit of the external apparatus 2 transmits the processing results to the secondary battery pack 21 via the input/output section 11. By the processing described above, the maintenance mode of the external apparatus 2 is ended. When the result of the processing carried out by the external apparatus 2 indicates an improper replacement of the battery cell 1, the integrated circuit 3 of the secondary battery pack 21 performs control to disable the use of the secondary battery pack 21.

(Effect of Battery Pack)

In the battery pack according to the first embodiment of the present invention, an improper replacement of a battery cell is detected based on a voltage variation of secondary batteries constituting the battery cell. For example, as the maintenance mode of the external apparatus 2, the secondary battery pack is fully charged and discharged periodically and voltages of the battery cell 1 are measured in time series to obtain a voltage variation from the measurement values. As a result, an improper replacement of the battery cell 1 is detected.

In the battery pack according to the first embodiment of the present invention, the battery pack can be inhibited from being used when a replacement of a battery cell is detected. Moreover, in the battery pack according to the first embodiment of the present invention, it is possible to execute, when wishing to carry out processing beyond a processing capability of the integrated circuit 3 mounted on the secondary battery pack 21, complicated calculations or calculation processing that uses a large amount of data without placing a load on the integrated circuit 3.

2. Second Embodiment

Next, a battery pack according to a second embodiment of the present invention will be described. In the battery pack according to the second embodiment, a polarization component of an impedance of secondary batteries is detected. The polarization component is detected for calculating a deterioration degree of the secondary batteries due to, for example, storage. It should be noted that the circuit structure and the like of the battery pack of the first embodiment is applicable to a circuit structure and the like of the battery pack according to the second embodiment of the present invention. Therefore, in descriptions below, points different from those of the first embodiment will be described, and the descriptions on the battery pack according to the first embodiment will be used for other parts.

(Detection Method)

A detection method carried out in the battery pack according to the second embodiment of the present invention will be described. In the battery pack according to the second embodiment of the present invention, data measured in the secondary battery pack 21 is transmitted to the external apparatus 2. The external apparatus 2 receives the data transmitted from the secondary battery pack 21 and processes the received data, and thereafter transmits the processing result to the secondary battery pack 21. The secondary battery pack 21 receives the processing result transmitted from the external apparatus 2 and carries out predetermined processing such as an update of a charge-discharge control method based on the received processing result.

Figures 8, 9:
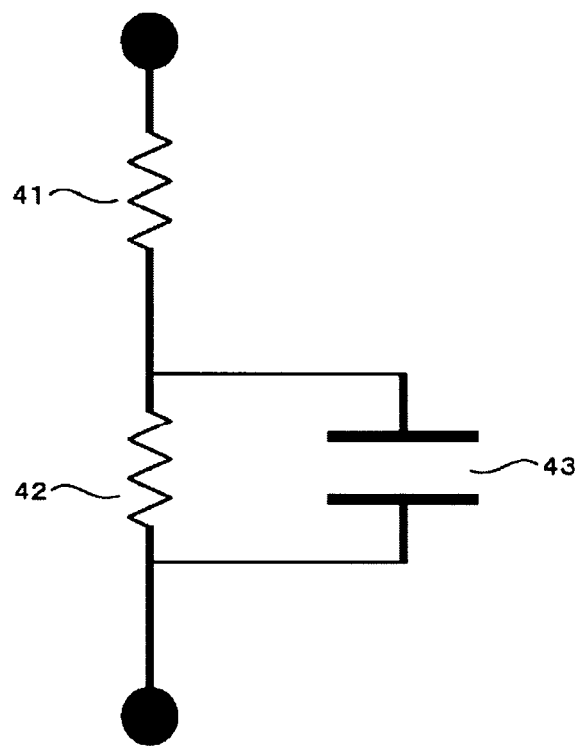
FIG. 8 is a table for explaining data stored in a memory of an external apparatus.
FIG. 9 is a circuit diagram showing an equivalence circuit of a secondary battery.

FIG. 9 shows an equivalence circuit of one secondary battery constituting the battery cell 1. An impedance of the secondary battery can be expressed by an equivalence circuit using an impedance 41, an impedance 42 connected to the impedance 41 in series, and a capacitor 43 connected to the impedance 42 in parallel. The impedance 41 expresses a DC component of the impedance of the secondary battery. The impedance 42 expresses a polarization component of the impedance of the secondary battery. In the secondary battery pack 21 of the second embodiment, a value $R_1$ of the impedance 42 and a capacity value $C_1$ of the capacitor 43 are detected.

Figure 10A:
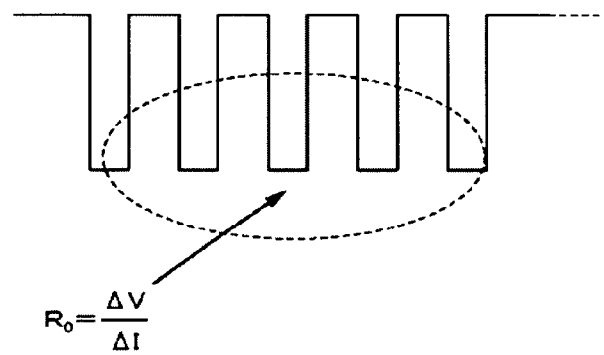
FIG. 10 are graphs for explaining a detection method carried out in a battery pack according to a second embodiment of the present invention.

FIG. 10 are graphs for explaining a detection method of $R_1$ and $C_1$. FIG. 10A shows an example of a voltage state of the secondary battery in a case where the charge current is switched ON/OFF during charging. By repetitively switching ON/OFF the charge-discharge control switch 9, a pulse-like charge current is supplied to the secondary battery, and the voltage of the secondary battery becomes a pulse-like waveform as shown in FIG. 10A. Thus, the voltage of the secondary battery fluctuates stably.

In such a case, based on a mean value of charge currents in a case where the charge-discharge control switch 9 is ON and a mean value of charge currents in a case where the charge-discharge control switch 9 is OFF, a mean value $\Delta I$ of charge current fluctuation amounts is calculated. Moreover, based on a mean value of voltages of the secondary battery in the case where the charge-discharge control switch 9 is ON and a mean value of voltages of the secondary battery in the case where the charge-discharge control switch 9 is OFF, a mean value $\Delta V$ of voltage fluctuation amounts of the secondary battery is calculated.

Using the mean value $\Delta I$ of the charge current fluctuation amounts calculated as described above and the mean value $\Delta V$ of the voltage fluctuation amounts of the secondary battery, a value $R_0$ of the impedance 41 during charging is calculated by $R_0 = \Delta V/\Delta I$.

Figure 10B:
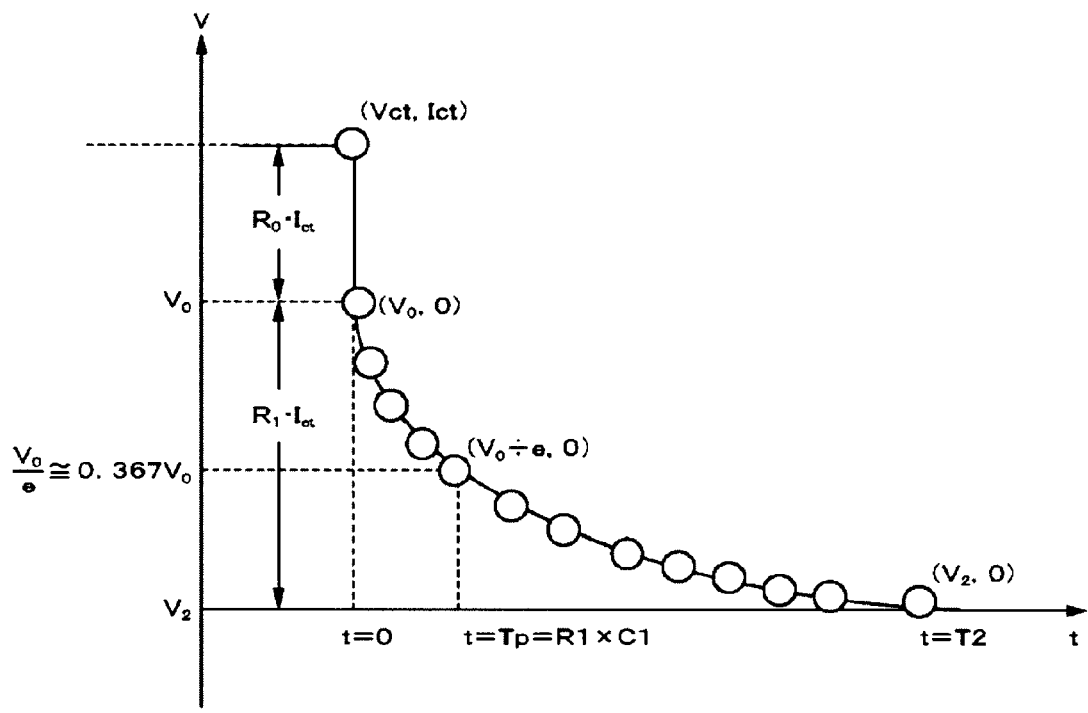

FIG. 10B is a graph showing a relationship between the time t and the voltage V of the secondary battery. The abscissa axis represents the time t, and the ordinate axis represents the voltage V. In FIG. 10B, with t set to 0 at a time charging is stopped, a measurement voltage at this time is expressed by (Vct, Ict). A voltage at t=0 after a voltage decrease is represented by $V_0$. A voltage change at t>0 can be expressed by the following expression.

$$V(t) = R_1 \cdot I_{ct} \cdot \text{Exp}\left(-\frac{t}{R_1 \cdot C_1}\right) \quad \text{[Expression 2]}$$

The voltage and current are measured at predetermined time intervals $\Delta t$ from t=0 until the voltage is stabilized. A measurement voltage at t=T2 at which the voltage is stabilized is represented by $V_2$. t at which $V_0/e$ is obtained is set to Tp. $R_1$ and $C_1$ can be respectively calculated by the following expressions.

$$R_1 = \frac{(V_{ct} - R_0 \cdot I_{ct} - V_2)}{I_{ct}} \quad \text{[Expression 3]}$$

$$C_1 = \frac{T_p}{R_1} = \frac{T_p \cdot I_{ct}}{(V_{ct} - R_0 \cdot I_{ct} - V_2)} \quad \text{[Expression 4]}$$

(Detection Processing)

Figure 11:
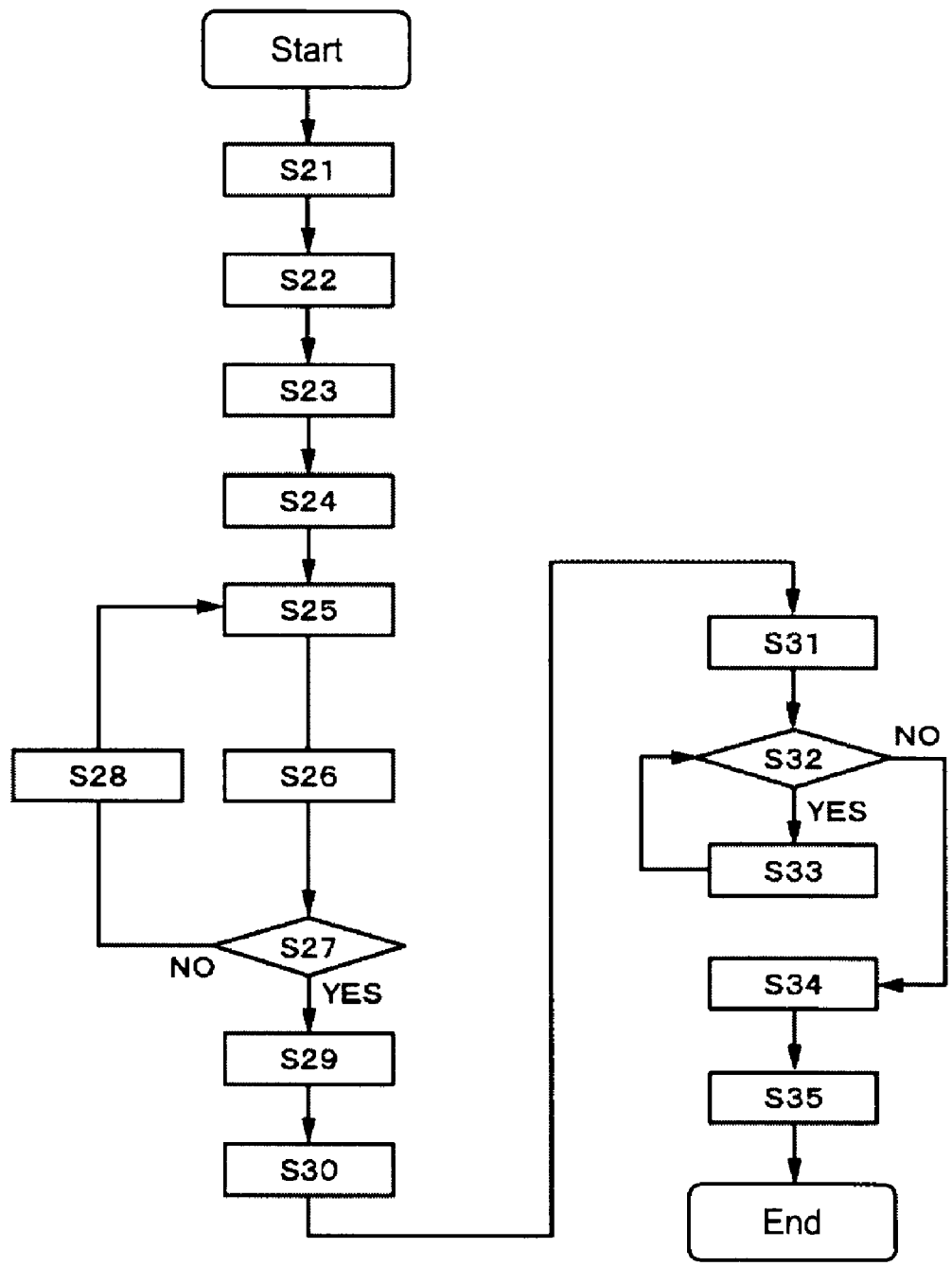
FIG. 11 is a flowchart for explaining a procedure of the detection method carried out in the battery pack according to the second embodiment of the present invention.

Detection processing of the battery pack according to the second embodiment of the present invention will be described with reference to the flowchart of FIG. 11. First, when the integrated circuit 3 of the secondary battery pack 21 detects a charge-stop condition in Step S21, the integrated circuit 3 measures a battery voltage V via the voltage detection circuit 7, measures a current I via the current detection circuit 5, and measures a temperature T via the temperature detection circuit 10 in Step S22. Data on the voltage, current, and temperature measured by the integrated circuit 3 is transmitted to the external apparatus 2 via the input/output section 11.

First, in Step S23, the integrated circuit (not shown) of the external apparatus 2 judges whether the temperature T is within a predetermined temperature data recorded on the ROM of the integrated circuit for maintaining a measurement accuracy. When the temperature T is within the predetermined temperature data, the integrated circuit (not shown) of the external apparatus 2 uses the measurement values V and I to execute setting processing of V_pre=V, variable k=0, Vct=V, Ict=I, and $V_0$=Vct−$R_0$*Ict to be stored in the RAM of the integrated circuit. When the temperature T is not within the predetermined temperature data, a display section (not shown) of the external apparatus 2 displays a high-temperature or low-temperature warning, and the processing is ended.

It should be noted that $R_0$ is an impedance of a DC component of the secondary battery. As described above with reference to FIG. 10A, for $R_0$, a value obtained by using the mean value $\Delta I$ of the charge current fluctuation amounts and the mean value $\Delta V$ of the voltage fluctuation amounts of the secondary battery in a case where the charge current is repetitively switched ON/OFF during charging is used. The processing of obtaining $R_0$ is carried out by the integrated circuit 3 on the secondary battery pack 21 side.

In Step S24, the integrated circuit 3 carries out charge-stop processing by turning off the charge-discharge control switch 9. In Step S25, the integrated circuit 3 measures the battery voltage V via the voltage detection circuit 7, measures the current I via the current detection circuit 5, and measures the temperature T via the temperature detection circuit 10. Data on the measured voltage, current, and temperature is transmitted to the external apparatus 2 via the input/output section 11.

In Step S26, the integrated circuit of the external apparatus 2 executes processing of setting V_new=V and V_mes [k]=V.

In Step S27, the integrated circuit of the external apparatus 2 executes processing of judging whether |V_new−V_pre|<$\Delta$V_Thresh is satisfied. For V_pre, a voltage measurement value V_mes [k−1] obtained one measurement before V_new is set. It should be noted that when the variable k is 0, the value of V_pre set in Step S23 is used.

$\Delta$V_Thresh is a predetermined threshold value stored in the integrated circuit of the external apparatus 2. $\Delta$V_Thresh is set to a numerical value that is unboundedly close to 0, and a value of the variable k at a time the voltage change is stabilized is obtained by the processing of judging whether |V_new−V_pre|<$\Delta$V_Thresh is satisfied.

When judged that |V_new−V_pre|<$\Delta$V_Thresh is satisfied in Step S27, the process advances to Step S29. When judged that |V_new−V_pre|<$\Delta$V_Thresh is not satisfied in Step S27, processing of incrementing k by 1 is carried out in Step S28, and the process returns to Step S25. Then, in Step S25, the battery voltage V, the current I, and the temperature T obtained after an elapse of a time $\Delta$Measure_Time since the last measurement are measured.

In Step S29, the integrated circuit of the external apparatus 2 carries out processing of calculating T2=k*$\Delta$Measure_Time. It should be noted that since a value obtained at a time the voltage change is stabilized is used as the value of k in this case, a time T2 at which the voltage is stabilized can be obtained by carrying out the processing of calculating T2=k*$\Delta$Measure_Time.

In Step S30, the integrated circuit of the external apparatus 2 executes processing of calculating $R_1$ by $R_1$=(Vct−$R_0$*Ict−V_mes [k])/Ict. By this processing, the value $R_1$ of the impedance 42 can be detected.

In Step S31, the integrated circuit of the external apparatus 2 executes processing of setting the value of the variable k to 0. In Step S32, the integrated circuit of the external apparatus 2 executes judgment processing on whether V_mes [k]<$V_0$*0.367 is satisfied.

When judged in Step S32 that V_mes [k] satisfies V_mes [k]<$V_0$*0.367, the integrated circuit of the external apparatus 2 executes processing of incrementing the value of k by 1 in Step S33.

When judged in Step S32 that V_mes [k] does not satisfy V_mes [k]<$V_0$*0.367, the process advances to Step S34. Then, in Step S34, the integrated circuit of the external apparatus 2 uses the value of k obtained at the time the process advances to Step S34 to execute processing of calculating a value of Tp by Tp=k*$\Delta$Measure_Time.

In Step S35, the integrated circuit of the external apparatus 2 executes processing of calculating a value of $C_1$ by $C_1$=Tp/$R_1$. By this processing, the capacity value $C_1$ of the capacitor 43 can be detected.

(Effect of Battery Pack)

In the battery pack according to the second embodiment of the present invention, it is possible to carry out processing that uses data of a size exceeding a capacity of the memory of the integrated circuit 3 mounted on the secondary battery pack 21. For example, by successively transmitting data measured on the secondary battery pack 21 side to the external apparatus 2 and storing and calculating the data on the external apparatus 2 side, calculations that use data of a size exceeding the capacity of the memory of the integrated circuit mounted on the secondary battery pack 21 becomes possible.

3. Third Embodiment

Next, a battery pack according to a third embodiment of the present invention will be described. In the battery pack of the third embodiment, a polarization component of an impedance of secondary batteries is detected. The polarization component is detected for calculating a deterioration degree of the secondary batteries due to, for example, storage. It should be noted that the circuit structure and the like of the battery pack of the first embodiment is applicable to a circuit structure and the like of the battery pack according to the third embodiment of the present invention. Therefore, in descriptions below, points different from those of the battery pack of the first embodiment will be described, and the descriptions on the battery pack according to the first embodiment will be used for other parts.

(Detection Method)

As described in the second embodiment, each of the secondary batteries constituting the battery cell 1 can be expressed by an equivalence circuit shown in FIG. 9. As in the second embodiment, the battery pack of the third embodiment calculates the value $R_1$ of the impedance 42 and the capacity value $C_1$ of the capacitor 43 shown in FIG. 9.

Figure 12A:
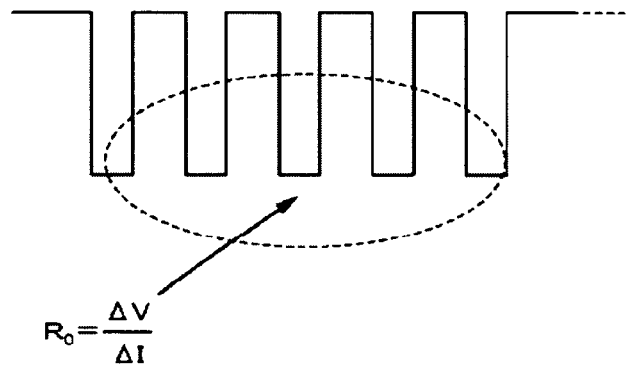
FIG. 12 are graphs for explaining a procedure of a detection method carried out in a battery pack according to a third embodiment of the present invention.

FIG. 12 are graphs for explaining a detection method carried out in the battery pack according to the third embodiment of the present invention. As shown in FIG. 12A, by switching ON/OFF the charge-discharge control switch 9, a polarization component can be canceled and $R_0$=$\Delta$V/$\Delta$I can be calculated. Since details are the same as those of the battery pack of the second embodiment, descriptions thereof will be omitted.

Figure 12B:
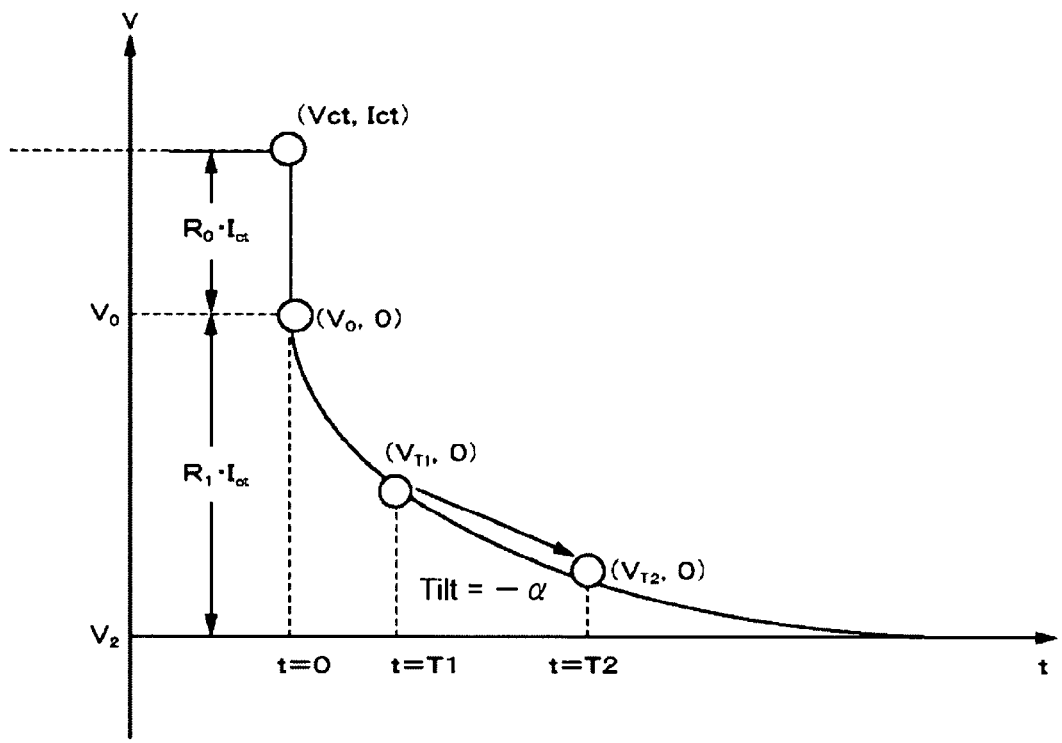

FIG. 12B is a graph showing a relationship between the time t and the voltage V of the secondary battery. The abscissa axis represents the time t, and the ordinate axis represents the voltage V. In the graph shown in FIG. 12B, a charge-stop time is set to be t=0, a measurement voltage at t=0 is represented by Vct, and a voltage at t=0 after a voltage decrease is represented by $V_0$. A measurement current at t=0 is represented by Ict. A voltage change at t>0 is expressed by the following expression.

$$V(t) = R_1 \cdot I_{ct} \cdot \mathrm{Exp}\!\left(-\frac{t}{R_1 \cdot C_1}\right) \quad \text{[Expression 5]}$$

When a measurement voltage at an arbitrary time t=T1 is represented by $V_{T1}$ and a measurement voltage at t=T2 is represented by $V_{T2}$, a tilt $-\alpha$ can be expressed by the following expression.

$$-\frac{R_1 \cdot I_{ct}}{R_1 \cdot C_1} \cdot \mathrm{Exp}\left(-\frac{T_1}{R_1 \cdot C_1}\right) = -\alpha \qquad \text{[Expression 6]}$$

$R_1$ and $C_1$ can be obtained by carrying out processing of calculating solutions of the nonlinear simultaneous equations above. This processing requires a high calculation capability since the processing involves calculating solutions of the nonlinear simultaneous equations. Therefore, processing of transmitting data on a voltage, current, and temperature measured by the secondary battery pack 21 to the external apparatus 2 and calculating the tilt $-\alpha$ by the integrated circuit of the external apparatus 2 and processing of calculating variables $R_1$ and $C_1$ using the above expressions are carried out. The processing result of the external apparatus 2 is transmitted to the secondary battery pack 21. Accordingly, the processing of calculating $R_1$ and $C_1$ can be carried out without placing a load on the integrated circuit 3.

(Effect of Battery Pack)

In the battery pack according to the third embodiment of the present invention, processing can be executed without placing a load on the integrated circuit 3 when wishing to perform processing beyond a processing capability of the integrated circuit 3 mounted on the secondary battery pack 21.

4. Other Embodiments

The present invention is not limited to the above embodiments, and various modifications and applications can be made without departing from the gist of the invention. For example, numerical values in the expressions used in the above embodiments and the like are mere examples, and different numerical values may be used as necessary. For example, in the first embodiment, the discharge curves of the assembled batteries a to c obtained by dividing the battery cell 1 into three have been processed to obtain voltage variations of the assembled batteries a to c, and the variations have been compared thereafter. However, the present invention is not limited thereto, and it is also possible to similarly process discharge curves of the secondary batteries 31 constituting the battery cell 1 to obtain voltage variations of the secondary batteries 31, and comparing them thereafter, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A battery pack, comprising:
   a plurality of batteries;
   a detection section to measure a voltage of each of the plurality of batteries to obtain a voltage variation of each of the plurality of batteries at different lapse times and compare the obtained voltage variations to thus detect whether at least one of the plurality of batteries has been replaced, the detection section sampling voltages of each of the plurality of batteries in a time-axis direction during discharge of the plurality of batteries after being charged, the detection section obtaining a square sum of a deviation of the sampled voltages for each of the samples, the detection section obtaining the voltage variation by adding up the obtained square sums of the deviations, and the detection section determining that at least one of the plurality of batteries has been replaced if a present voltage variation is less than or equal to a previously measured voltage variation; and
   a controller to disable, when a result of the detection by the detection section indicates that at least one of the plurality of batteries has been replaced, a use of the plurality of batteries.

2. The battery pack according to claim 1, wherein the detection section detects that at least one of the plurality of batteries has been replaced when the voltage variation at a first lapse time is smaller than the voltage variation at a second lapse time shorter than the first lapse time upon comparing the voltage variations.

3. The battery pack according to claim 1, wherein each of the plurality of batteries is constituted of a plurality of batteries connected in parallel.

4. The battery pack according to claim 1, further comprising:
   a transmission section to transmit data on the measured voltages of the plurality of batteries to an external apparatus; and
   a reception section to receive the result of the detection carried out by the external apparatus using the transmitted data.

5. A battery pack, comprising:
   a plurality of batteries;
   a measurement section to measure a voltage and a current of the plurality of batteries, the measurement section sampling voltages of each of the plurality of batteries in a time-axis direction during discharge of the plurality of batteries after being charged;
   a transmission section to transmit data on the voltage and the current measured by the measurement section to an external apparatus; and
   a reception section to receive a result of predetermined processing carried out by the external apparatus using the transmitted data on the voltage and the current, the predetermined processing obtaining a square sum of a deviation of the sampled voltages for each of the samples, obtaining the voltage variation by adding up the obtained square sums of the deviations, and determining that at least one of the plurality of batteries has been replaced if a present voltage variation is less than or equal to a previously measured voltage variation; and
   a controller to disable, when a result of the detection by the result indicates that at least one of the plurality of batteries has been replaced, a use of the plurality of batteries.

6. A detection method, comprising:
   measuring, using a processor, a voltage of each of a plurality of batteries included in a battery pack to obtain a voltage variation of each of the plurality of batteries at different lapse times, sampling voltages of each of the plurality of batteries in a time-axis direction during discharge of the plurality of batteries after being charged, obtaining a square sum of a deviation of the sampled voltages for each of the samples, obtaining the voltage variation by adding up the obtained square sums of the deviations, and determining that at least one of the plurality of batteries has been replaced if a present voltage variation is less than or equal to a previously measured voltage variation; and
   disabling, when a result of the detection indicates that at least one of the plurality of batteries has been replaced, a use of the plurality of batteries.

7. The detection method according to claim 6, wherein the detection includes detecting that at least one of the plurality of batteries has been replaced when the voltage variation at a first lapse time is smaller than the voltage variation at a second lapse time shorter than the first lapse time upon comparing the voltage variations.

8. The detection method according to claim 6, wherein each of the plurality of batteries is constituted of a plurality of batteries connected in parallel.

9. The detection method according to claim 6, further comprising:
   transmitting data on the measured voltages of the plurality of batteries to an external apparatus; and
   receiving the result of the detection carried out by the external apparatus using the transmitted data.

10. A detection method, comprising:
   measuring, using a processor, a voltage and a current of a plurality of batteries included in a battery pack, the measuring sampling voltages of each of the plurality of batteries in a time-axis direction during discharge of the plurality of batteries after being charged;
   transmitting data on the measured voltage and current to an external apparatus;
   receiving a result of predetermined processing carried out by the external apparatus using the transmitted data on the voltage and the current, the predetermined processing obtaining a square sum of a deviation of the sampled voltages for each of the samples, obtaining the voltage variation by adding up the obtained square sums of the deviations, and determining that at least one of the plurality of batteries has been replaced if a present voltage variation is less than or equal to a previously measured voltage variation; and
   disabling, when a result of the detection by the result indicates that at least one of the plurality of batteries has been replaced, a use of the plurality of batteries.

* * * * *